(12) United States Patent
Eifert

(10) Patent No.: US 8,373,999 B1
(45) Date of Patent: Feb. 12, 2013

(54) GRIPPING PWB HEX STANDOFF

(75) Inventor: Daniel J. Eifert, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 374 days.

(21) Appl. No.: 12/180,291

(22) Filed: Jul. 25, 2008

Related U.S. Application Data

(60) Provisional application No. 60/952,466, filed on Jul. 27, 2007.

(51) Int. Cl.
 *H05K 7/02* (2006.01)
 *H05K 7/04* (2006.01)
 *H05K 3/36* (2006.01)
 *B23P 19/00* (2006.01)
 *H01B 17/00* (2006.01)

(52) U.S. Cl. .... 361/804; 29/739; 174/137 R; 174/138 G

(58) Field of Classification Search .................. 361/761, 361/807; 29/739; 439/74; 174/50, 520, 174/138 D, 138 G, 156, 158 R, 166 S, 137 R
See application file for complete search history.

(56) References Cited

U.S. PATENT DOCUMENTS

| | | | | |
|---|---|---|---|---|
| 2,158,378 A * | 5/1939 | Olson | | 411/165 |
| 3,016,250 A * | 1/1962 | Franck | | 285/342 |
| 3,124,031 A * | 3/1964 | Knohl | | 411/418 |
| 3,148,356 A * | 9/1964 | Hedden, Jr. | | 365/55 |
| 3,556,570 A * | 1/1971 | Cosenza | | 411/176 |
| 4,043,369 A * | 8/1977 | Abernethy | | 411/277 |
| 4,760,495 A * | 7/1988 | Till | | 361/804 |
| 5,620,290 A * | 4/1997 | Homfeldt et al. | | 411/533 |
| 5,797,175 A * | 8/1998 | Schneider | | 29/520 |
| 5,956,835 A * | 9/1999 | Aksu | | 29/468 |
| 5,963,432 A * | 10/1999 | Crowley | | 361/804 |
| 6,261,039 B1 * | 7/2001 | Reed | | 411/178 |
| 6,431,879 B2 * | 8/2002 | Brekosky et al. | | 439/74 |
| 6,435,788 B2 * | 8/2002 | Reed | | 411/178 |
| 6,439,817 B1 * | 8/2002 | Reed | | 411/110 |
| 6,493,233 B1 * | 12/2002 | De Lorenzo et al. | | 361/752 |
| 6,609,914 B2 * | 8/2003 | Dibene, II | | 439/74 |
| 6,644,903 B1 * | 11/2003 | Arand | | 411/352 |
| 6,781,055 B2 * | 8/2004 | Chen | | 174/535 |
| 6,817,815 B2 * | 11/2004 | Ross | | 411/180 |
| 6,902,567 B2 * | 6/2005 | Del Medico | | 606/71 |
| 7,678,151 B2 * | 3/2010 | Ek | | 623/20.14 |
| 2003/0007844 A1 * | 1/2003 | Terry | | 411/186 |
| 2007/0009341 A1 * | 1/2007 | Nagayama | | 411/432 |
| 2010/0143069 A1 * | 6/2010 | Moore | | 411/392 |
| 2010/0204701 A1 * | 8/2010 | Tallarida et al. | | 606/80 |

\* cited by examiner

*Primary Examiner* — Timothy Thompson
*Assistant Examiner* — Nathan Milakovich
(74) *Attorney, Agent, or Firm* — Withrow & Terranova, PLLC

(57) ABSTRACT

A standoff device and a concomitant method of attaching the same to a printed wiring board, comprising inserting into an opening in the printed wiring board a standoff device comprising a threaded body, a neck region narrower and atop the body, and a hexagonal head atop the neck and comprising one or more anti-turn features, and threading a nut onto the body to contact a side of the printed wiring board opposite that contacted by the hexagonal head.

12 Claims, 3 Drawing Sheets

GRIPPING PWB HEX STANDOFF

CROSS-REFERENCE TO RELATED APPLICATIONS

This application claims priority to and the benefit of the filing of U.S. Provisional Patent Application Ser. No. 60/952,466, entitled "Gripping PWB Hex Standoff", filed on Jul. 27, 2007, and the specification and claims thereof are incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. W31P4Q-05-C-0221 awarded by the U.S. Army.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to printed wiring board (PWB) standoff devices.

2. Description of Related Art

Standoffs are commonly used in the electronics industry to securely hold one circuit board (e.g., a motherboard) to another circuit board (e.g., a daughterboard), or to hold or attach some other component a fixed distance from the circuit board. Standoffs function as a mechanical mating device that securely holds components a fixed distance apart.

FIG. 2 shows a simple standoff designed for sheet metal. Its round design is not suitable for holding and manipulating, and the gripping area is not suitable for printed wiring board (PWB) material. Most standoffs used with PWBs have male threads on one end and female on the other (see FIG. 3(a)) or are swaged onto the PWB (see FIG. 4(a)). If a very short standoff is needed the male/female version has too few threads on the female side and swaged standoffs always have the potential of spinning which renders them useless and hard to repair.

The present invention provides a standoff that provides an anti-turn feature, allows unlimited mating engagement, needs no special tooling to install or remove, is process insensitive, can be fabricated to any length, and is hex-shaped for best holding and manipulating.

BRIEF SUMMARY OF THE INVENTION

The present invention is of a standoff device and a concomitant method of attaching the same to a printed wiring board, comprising: inserting into an opening in the printed wiring board a standoff device comprising a threaded body, a neck region narrower and atop the body, and a hexagonal head atop the neck and comprising one or more anti-turn features; and threading a nut onto the body to contact a side of the printed wiring board opposite that contacted by the hexagonal head. In the preferred embodiment, the one or more anti-turn features comprise one or more protrusions downward from a base of the head, most preferably six protrusions, one at each vertex of the base of the hexagonal head, and most preferably wherein the one or more protrusions comprise point barbs. The threaded body comprises exterior threading. The standoff device additionally comprises a hole extending through the body, neck, and head, more preferably wherein the hole is threaded on at least a portion thereof, and most preferably wherein the hole is threaded on the entirety thereof. The device does not rotate after the threading step has been completed. The threading step can comprise using a hexagonal wrench to hold the head during the threading.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
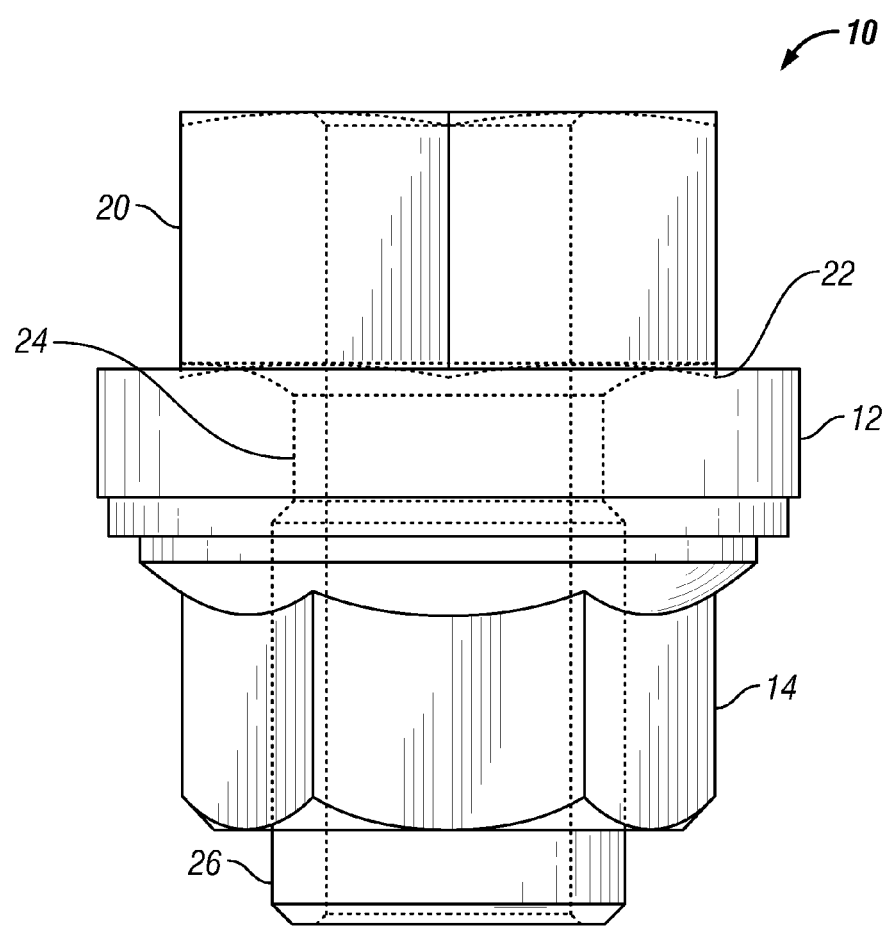
FIG. 1 is a side view of an embodiment of the invention engaging a PWB and used in conjunction with a standard nut.
Figure 2:
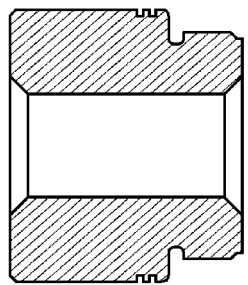
FIG. 2 is a side cut-away view of a simple prior art standoff device.
Figure 3A:
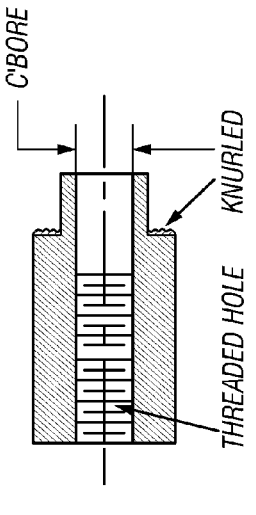
FIGS. 3(a) and (b) are views of a prior art standoff device used with PWBs.
Figure 3B:
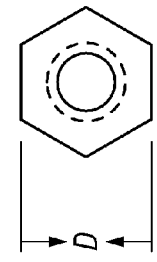
Figure 4A:
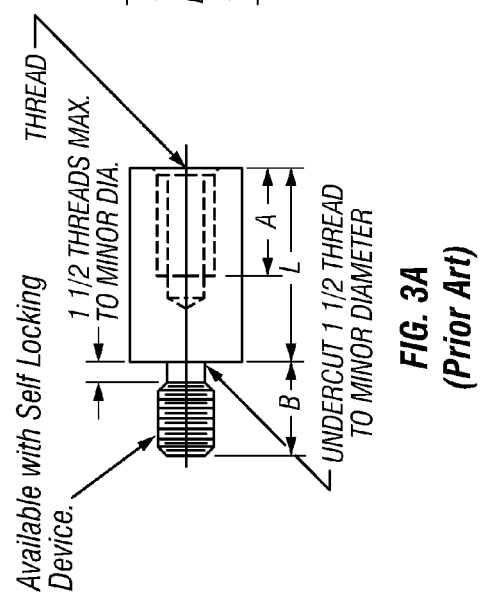
FIGS. 4(a) and (b) are views of another prior art standoff device used with PWBs.
Figure 4B:
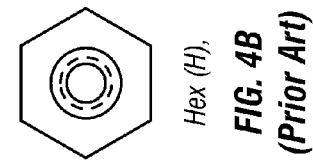
Figure 5:
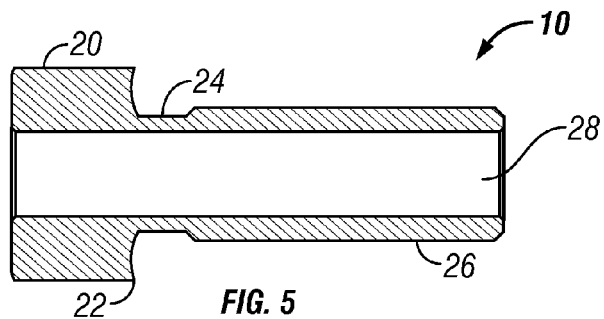
FIG. 5 is a side cut-away view of an embodiment of the invention.
Figure 8:
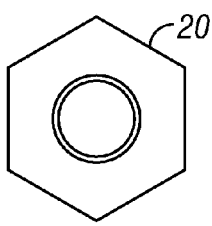
FIG. 8 is a top view of an embodiment of the invention.

The present invention provides a standoff that provides an anti-turn feature, allows unlimited mating engagement, needs no special tooling to install or remove, is process insensitive, can be fabricated to any length, and is hex-shaped for best holding and manipulating. An embodiment of the invention 10 is shown in FIG. 1 installed into a PWB 12 using a standard nut 14 (in this case hexagonal). The standoff of FIG. 1 comprises head portion 20, preferably hexagonal as shown in FIG. 8 (but square, octagonal, and other shapes that are readily grippable may be employed), neck portion 24, and body portion 26 (preferably having an exterior diameter larger than the exterior diameter of the neck portion). The head portion preferably comprises downward pointing projections 22 (for gripping the PWB), preferably numbering six with a hexagonal head. With a square head, the projections would preferably number four, with an octagonal head eight, etc. As shown in FIG. 5, the embodiment preferably has a central hole 28 extending through the head portion, the neck portion, and the body portion.

Figure 6:
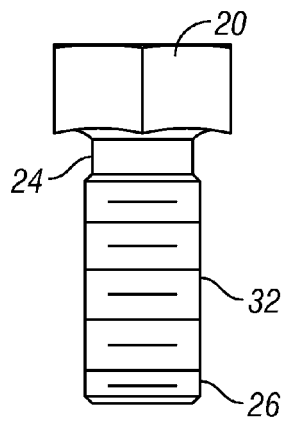
FIG. 6 is a side view of an embodiment of the invention.
Figure 7:
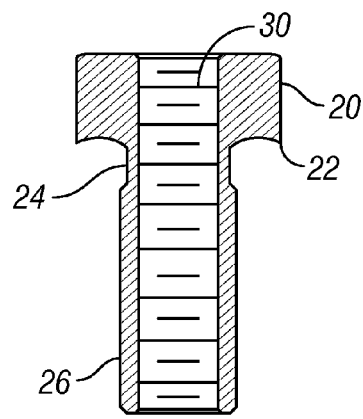
FIG. 7 is a side cut-away view of an embodiment of the invention showing preferred internal threading.

As shown in FIGS. 6 and 7, the present invention preferably employs in the central hole interior threading 30 and also employs exterior threading 32 to secure the invention to the PWB by means of a nut from the back of the PWB. Interior threading 30 is shown extending the length of the central hole, but it can be placed in portions of the central only if desired. Similarly, exterior threading 32 is shown extending from the top of the body portion to near the bottom of the body portion, but it could extend the entire length of the body portion if desired, or begin lower than the top of the body portion.

The embodiment incorporates a board gripping feature 22 to resist spinning and is replaceable with standard tools, requiring no drilling or pressing for replacement. The downward projections preferably comprise point barbs. However, the downward projections could if desired comprise knurled sections or other known means to secure against spinning. The head of the invention also incorporates an overall shape (preferably hexagonal) to provide a means for holding the part during assembly and to assist with disassembly should the anti-turn feature fail. The invention allows unlimited mating screw penetration.

The preferred material from which the invention is fabricated is stainless steel, but other metal or alloys (e.g., titanium alloys), can be used if desirable.

While the preferred embodiment of the invention is directed to PWB's, the invention is also useful in separating any type of rigid or somewhat flexible devices, and securing non-PWB devices from one another at a fixed distance.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A standoff device for a printed wiring board, said device comprising:
   a threaded body comprising exterior threads extending from a top of said body to a bottom of said body;
   a neck region narrower and atop said body;
   a hexagonal head atop said neck and comprising one or more anti-turn features; and
   a threaded hole extending through said body, neck, and head, said threads extending from said body to said head.

2. The standoff device of claim 1 wherein said one or more anti-turn features comprise one or more protrusions downward from a base of said head.

3. The standoff device of claim 2 wherein said one or more protrusions comprise six protrusions, one at each vertex of said base of said hexagonal head.

4. The standoff device of claim 2 wherein said one or more protrusions comprise point barbs.

5. The standoff device of claim 1 wherein said device does not rotate when secured to the printed wiring board.

6. The standoff device of claim 1 wherein said device does not rotate when secured to the printed wiring board using a nut.

7. A method of attaching a standoff device to a printed wiring board, the method comprising the steps of:
   inserting into an opening in the printed wiring board a standoff device comprising a threaded body, the threaded body comprising exterior threads extending from a top of the body to a bottom of the body, a neck region narrower and atop the body, a hexagonal head atop the neck and comprising one or more anti-turn features, and a threaded hole extending through the body, neck, and head, the threads extending from the body to the head; and
   threading a nut onto the body to contact a side of the printed wiring board opposite that contacted by the hexagonal head.

8. The method of claim 7 wherein the one or more anti-turn features comprise one or more protrusions downward from a base of the head.

9. The method of claim 8 wherein the one or more protrusions comprise six protrusions, one at each vertex of the base of the hexagonal head.

10. The method of claim 8 wherein the one or more protrusions comprise point barbs.

11. The method of claim 7 wherein the device does not rotate after the threading step.

12. The method of claim 7 wherein the threading step comprises using a hexagonal wrench to hold the head during the threading.

* * * * *